(12) United States Patent
Di Liberto et al.

(10) Patent No.: US 12,322,580 B2
(45) Date of Patent: Jun. 3, 2025

(54) ELECTROMAGNETIC FIELD SIGNAL ACQUISITION SYSTEM FOR HIGH SIGNAL-TO-NOISE RATIOS, AND ELECTRICAL NOISE IMMUNITY

(71) Applicant: DUBLIN CITY UNIVERSITY, Dublin (IE)

(72) Inventors: Alessio Di Liberto, Dublin (IE); David Coates, Dublin (IE); Niall MacGearailt, Dublin (IE); Sean Kelly, Dublin (IE); Patrick McNally, Dublin (IE); Rajani K. Vijayaraghavan, Dublin (IE)

(73) Assignee: DUBLIN CITY UNIVERSITY (IE)

( * ) Notice: Subject to any disclaimer, the term of this patent is extended or adjusted under 35 U.S.C. 154(b) by 116 days.

(21) Appl. No.: 17/918,799

(22) PCT Filed: Apr. 21, 2021

(86) PCT No.: PCT/EP2021/060455
§ 371 (c)(1),
(2) Date: Oct. 13, 2022

(87) PCT Pub. No.: WO2021/214185
PCT Pub. Date: Oct. 28, 2021

(65) Prior Publication Data
US 2023/0352281 A1    Nov. 2, 2023

(30) Foreign Application Priority Data

Apr. 21, 2020   (GB) .................................... 2005828

(51) Int. Cl.
*H01J 37/32*        (2006.01)
(52) U.S. Cl.
CPC ............... *H01J 37/32917* (2013.01); *H01J 2237/24507* (2013.01)

(58) Field of Classification Search
CPC ............... H01J 37/32917; H01J 2237/24507
See application file for complete search history.

(56) References Cited

U.S. PATENT DOCUMENTS

| 2004/0189419 A1 | 9/2004 | Essenwanger |
| 2005/0183821 A1* | 8/2005 | Parsons ............ H01J 37/32935 118/723 R |

FOREIGN PATENT DOCUMENTS

| WO | 2004006285 A1 | 1/2004 |
| WO | 2018177965 A1 | 10/2018 |

OTHER PUBLICATIONS

Andreas Mandelis; "New Instruments and Components"; Review of Scientific Instruments New Products; Instrum 90; Jul. 24, 2019; (5 pages).

(Continued)

*Primary Examiner* — Dani Fox
*Assistant Examiner* — Fani Polyzos Boosalis
(74) *Attorney, Agent, or Firm* — K&L GATES LLP

(57) ABSTRACT

The present invention is directed towards an apparatus and method to detect electromagnetic radiation or signals emitted by plasma comprising a sensor unit, the sensing unit comprising a first sensor for detecting electromagnetic radiation or signals; an electromagnetic barrier wherein the electromagnetic barrier is configured to surround the first sensor to prevent ambient electromagnetic radiation reaching the first sensor; a first port through which electromagnetic radiation can pass, the port configured for coupling to a port of a plasma chamber such that electromagnetic radiation or signals emitted from the plasma can reach the first sensor; and a first output coupled with a balun and a dual coaxial system whereby a signal sensed is grounded and a phase reversed version of the signal is grounded. A signal (Continued)

acquisition system (SAS) for detecting electromagnetic radiation emitted by a plasma is also described.

10 Claims, 5 Drawing Sheets

(56) References Cited

OTHER PUBLICATIONS

PCT International Search Report and PCT Written Opinion for PCT International Patent Application No. PCT/EP2021/060455; date of mailing Aug. 19, 2021; (12 pages).

\* cited by examiner

ELECTROMAGNETIC FIELD SIGNAL ACQUISITION SYSTEM FOR HIGH SIGNAL-TO-NOISE RATIOS, AND ELECTRICAL NOISE IMMUNITY

CROSS REFERENCE TO RELATED APPLICATIONS

This is the national phase under 35 U.S.C. § 371 of International Application No. PCT/EP2021/060455 filed on Apr. 21, 2021, which claims priority to and the benefit of United Kingdom Application No. 2005828.5 filed on Apr. 21, 2020, the entire disclosures of each of which are incorporated by reference herein.

FIELD

The present disclosure is directed towards the improvements in the control and measurement of a plasma. In particular, the present disclosure is directed to improving the signal-to-noise ratios of measurement signals obtained from a plasma and increasing the electrical noise immunity of the system used to obtain these measurements.

BACKGROUND

Plasmas are extremely common and are used in many manufacturing and industrial processing settings. For example, low pressure systems are used for advanced materials processing, including for materials deposition and/or etch processes in e.g. the semiconductor or medical industry sectors. As a further example, atmospheric pressure plasma processing systems also have industrial applications, e.g. materials cleaning, bonding, deposition, or etching for e.g. the aeronautical, auto industry, and other sectors.

Improved control over plasma properties in industrial semiconductor processing equipment is important due to the trend towards increased process automation. One consideration in improving the control of plasma properties is the measurement of plasma properties. At present invasive plasma measurement techniques are the oldest and most commonly used procedures for measuring the properties of plasmas. These techniques involve one or more probes being immersed in the plasma under study.

However, invasive plasma measurement techniques are undesirable in most industrial circumstances. In particular, plasmas generate conditions which are often harsh to many probes used for measurement. As a result, the probes used for invasive plasma measurement techniques are expensive and/or prone to failure. In addition, the probes themselves can interact with the plasma which changes, sometimes unpredictably, the characteristics of the plasma. These problems reduce the accuracy of measurement, and in turn, control of the plasma.

Furthermore, the equipment used for invasive plasma measurement techniques are difficult to retrofit to existing fabrication equipment and infrastructures. In addition to this difficulty, the disruptive impact of fitting invasive plasma measurement equipment can potentially introduce additional complexities to a fabrication line. This in turn can adversely impact process replication, which is a key necessity for high volume production. The risk of adding complexity and cost to a fabrication line has therefore slowed improvement in the measurement and control of plasmas.

Thus, non-invasive plasma measurement techniques are likely to provide huge improvements in the control of plasmas. For example, non-invasive plasma measurement equipment can be coupled to existing plasma equipment easily. A further advantage is that the existing plasma equipment can be left in situ when coupled to the non-invasive plasma measurement equipment thereby reducing the risk of adding complexity and cost to a fabrication line. Non-invasive plasma measurement is also significantly more accurate than invasive plasma measurement. Unlike many existing probe systems, non-invasive plasma measurement does not require a probe to be located in the plasma. As a result, non-invasive plasma measurement does not disturb the plasma itself (which eliminates the risk of the probe altering the measurements one is attempting to obtain). An example system is described in a paper by K Suzuki and M Sato entitled 'Advanced technology for monitoring plasma sparking ESD damage using high frequency magnetic field sensors' 2003 Electrical Overstress/Electrostatic Discharge Symposium. Various patent publications describe electromagnetic field signal acquisition systems for high signal-to-noise ratios, and electrical noise immunity, for example US2005/0183821; JP H05188151; JP H1167732 and EP 1394835.

The present disclosure builds on the contribution provided by PCT/EP2018/057556 and the paper by S. Kelly and P. J. McNally, *Appl. Phys. Express* 10 (2017) 096101, which describes Radio Emission Spectroscopy (RES) systems. In a typical embodiment, in order to measure and control plasma properties in a plasma process chamber, a RES system involves the placement of: a near field (NF) electric field (E-field) antenna, and/or a NF magnetic field (B-field) antenna in close proximity to (e.g. preferably 40 mm or less) to the interior of the plasma process chamber. Crucially, the antenna(s) are located externally to the plasma, i.e. according to the present disclosures antenna(s) are not immersed and do not make physical contact with a plasma in use.

However, for example in a typical semiconductor fabrication plant, which typically comprises multiple plasma processing systems, each comprising at least one plasma chamber, these plasma processing systems do not sit individually in electromagnetic (radio frequency—RF) isolation from each other. Indeed, a fabrication plant could comprise of tens or more of these systems all working simultaneously, and all capable of producing RF electromagnetic emissions. As a result, these processing systems can interfere with each other and with the RES system.

In addition, other local RF sources may be present. As another example, high speed electrical equipment can generate electromagnetic noise. Thus, it is crucial to devise a RES system which is capable of only receiving electromagnetic signals from an individual plasma process chamber towards which it is targeted. Crucially, the RES system must be immune to noise signals, for example signals emanating from other electronic systems (including e.g. other plasma process chambers, ancillary electrical equipment, etc.) and general broadband local RF background emissions. A signal from an antenna head is susceptible to 'skin' induced noise from a cable. The operating environment of plasma chambers is dense in RF noise both from the controlling machines/computers and adjacent plasma chambers, for example in an industrial environment machines are arranged in long lines in a 'chase'. This results in RF interference. Moreover the signal levels from an antenna or antennae are extremely low and any local amplification tends to introduce wideband noise which affects any measurements. A further problem with RES systems is that common-mode currents are found to occur between a sensor head and a chamber being monitored, which also results in interference.

Thus, in order to address this and other issues with the prior art, the present disclosure is directed towards a Signal Acquisition System (SAS) for a RES system which: i) has high signal-to-noise immunity; ii) is adapted to receive RES signals from the plasma source (e.g. the plasma process chamber) which it is being used to measure; and iii) is immune to the reception of radio frequency signals from the surrounding environment, for example RES signals from other adjacent chambers on the same processing tool.

SUMMARY

The present disclosure is directed towards apparatuses the features of which are set out in the appended claims.

In particular, the present disclosure is directed towards an apparatus for detecting electromagnetic radiation emitted by plasma comprising a first sensor unit, the first sensing unit comprising: a first sensor for detecting electromagnetic radiation; an electromagnetic barrier wherein in the electromagnetic barrier is configured to surround the first sensor to prevent ambient electromagnetic radiation reaching the first sensor; a first port through which electromagnetic radiation can pass, the port configured for attachment to a port of a plasma chamber such that electromagnetic radiation emitted from the plasma can reach the first senor; and a first output, coupled to the sensor, wherein the output is configured to be coupled to a cable whereby the signal detected by the first sensor can be provided to a separate receiver, transceiver or transmitter unit.

In one embodiment there is provided an apparatus to detect electromagnetic radiation or signals emitted by plasma comprising a sensor unit, the sensing unit comprising:
- a first sensor for detecting electromagnetic radiation or signals;
- an electromagnetic barrier wherein in the electromagnetic barrier is configured to surround the first sensor to prevent ambient electromagnetic radiation reaching the first sensor;
- a first port through which electromagnetic radiation can pass, the port configured for coupling to a port of a plasma chamber such that electromagnetic radiation or signals emitted from the plasma can reach the first senor; and
- a first output coupled with a balun and a dual coaxial system whereby a signal sensed is grounded and a phase reversed version of the signal is grounded.

While Faraday cage type implementations can provide an electromagnetic barrier, existing prior art systems in the field of measuring plasma signals suffer from a number of problems such as noise from common mode currents that occur. The present invention overcomes these problems by providing a dual coaxial configuration combined with a coupling and decoupling balun at either end of the system.

In a preferred embodiment of the present invention a balun/dual-coax/balun system is positioned in close proximity to the sensor head. In effect the balun/dual-coax/balun approach of the present invention, where both the signal and the phase inverted version of the signal lines are separately noise isolated in two different cables overcomes the problem of noise and common mode currents associated with signal acquisition when measuring signals emitted from a plasma source.

The Signal Acquisition System is designed so it is electrically isolated from its environment and only the NF E-field and NF B-field sensor (e.g. antennae) connected to the Signal Acquisition System can receive RF signals.

Providing the first sensor as a separate unit and allows for its remote installation from a receiver, transmitter or transceiver and reduces the number of components local to the first sensor that can interfere with the readings of the first sensor.

Providing the first sensor as a separate unit and allows for its remote installation from a receiver, transmitter or transceiver and reduces the size of the first sensor to as to most efficiently attach to the first port in a space constrained plasma system. Furthermore, with systems with a plurality of chambers, the remote first ports may be coupled to the separate receiver, transceiver or transmitter unit or units.

Preferably, the first sensor is a near field antenna, but the system can also be configured for intermediate field or far field operational, if desired.

Preferably, the first output is a balanced output configured for coupling to one or more cables to provide a differential signal. This allows the first output to be coupled to balanced differential cables, which are readily available components. Advantageously, the use of a balanced cables means that the resultant system rejects common-mode interference from external sources.

Preferably, the sensor unit comprises a balun configured to convert an unbalanced signal provided by the first sensor to a balanced signal provided to the first output.

In one embodiment, the sensor unit comprises a second sensing unit, wherein the second sensing unit comprises: a second sensor for detecting electromagnetic radiation; an electromagnetic barrier wherein in the electromagnetic barrier is configured to surround the second sensor to prevent ambient electromagnetic radiation reaching the second sensor; a second port through which electromagnetic radiation can pass, the port configured for attachment to a matching unit of a plasma chamber such that electromagnetic radiation emitted from matching unit can reach the second sensor; and an second output, coupled to the second sensor, wherein the second output is configured to be coupled to a cable.

This arrangement produces a differential signal which is measurement of current and/or voltage phase difference across substrate/workpiece being operated on by the plasma.

Additionally, in circumstances where the connectors to the antennae are either in receive or transmit mode, then a directional coupler can be attached, configured to allow for reflection/transmission measurements to be implemented. For example this can be used to acquire fundamental impedance measurements for the transmission line comprised of the antenna and attached balun and cabling.

Preferably, the first and second outputs are balanced outputs.

Preferably, the first and second outputs are cross coupled to baluns to produce a third output, wherein the third output is a balanced output which is a function of the current and/or voltage phase difference between the signal received by the first sensor and the signal received by the second sensor.

In another embodiment there is provided a method to detect electromagnetic radiation or signals emitted by plasma, the method comprising the steps of:
- detecting electromagnetic radiation or signals;
- configuring an electromagnetic barrier to surround a first sensor to prevent ambient electromagnetic radiation reaching the first sensor;
- coupling a first port associated with the sensor through which electromagnetic radiation can pass, with a port of a plasma chamber such that electromagnetic radiation or signals emitted from the plasma can reach the first senor; and coupling a first output with a balun and a dual coaxial system whereby a signal sensed is grounded and a phase reversed version of the signal is grounded.

The present disclosure is also directed towards, but not limited to, a signal acquisition system (SAS) for detecting electromagnetic radiation emitted by a plasma comprising: an apparatus for detecting electromagnetic radiation according to any preceding claim; a further enclosure comprising: a receiver, transmitter or a transceiver for wirelessly providing the signal obtained by the apparatus to a control unit; and an electromagnetic barrier wherein in the electromagnetic barrier is configured to surround the receiver, transmitter or transceiver to prevent ambient electromagnetic radiation reaching the receiver, transmitter or transceiver; and at least one cable for providing the signal received by the apparatus to the receiver, transmitter or transceiver.

Preferably, the cable is a balanced cable. More preferably, the cable is a pair of coaxial cables, wherein the cables are configured to connect a ground connection from the apparatus to the further enclosure.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

Figure 1:
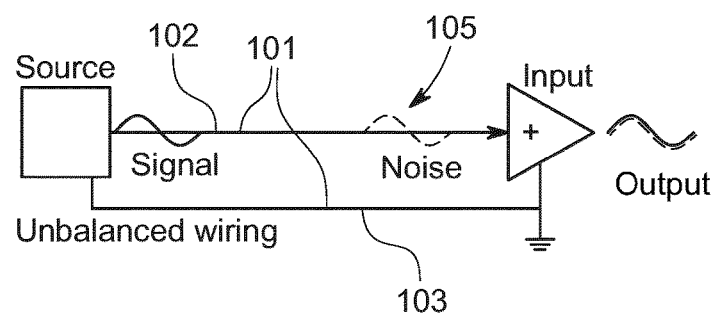
FIG. 1 illustrates an example of unbalanced wiring.

A typical RES comprises a sensor (such as e.g. an antenna) to measure a plasma coupled to a receiver or transceiver to provide the measurements obtained from the sensor to a control system and to optionally receive control signals from the control system. The example of a receiver or transceiver is exemplary and optionally a transmitter could be used instead.

In a RES system it is important to ensure that the signals received by the sensor emanated from the plasma system (e.g. a plasma chamber) under observation or test. Therefore, the sensors of the RES system (e.g. E-field and/or B-field antennae, or similar sensors) are often placed close to an access port on the plasma system under test. This access port typically consists of a glass/quartz/dielectric window which may, or may not, afford direct visible observation of the plasma. Regardless of direct visible access, RF emissions from the plasma can still pass through this access port. The invention can work for both situations when the plasma is directly visible or not. In addition to using off-the-shelf NF, B-field, E-field, or similar antennae, a custom sensor can be built or manufactured. This can include the manual or automated deposition of dielectric and/or conducting components on a glass, dielectric, wood, or similar substrates, in order to custom build a sensor or antenna appropriate to the requirements of the RES system.

Such a system is described in detail in PCT patent application number PCT/EP2018/057556, assigned to Dublin City University, and fully incorporated herein by reference.

Very high precision and accuracy is required to detect small changes in the amplitudes or intensities of the signals received by a sensor. In order to do this noise must be minimised, i.e. the signal-to-noise ratios in the signals received by a RES must be maximised.

However, placing a sensor close to an access port of a plasma system does not guarantee that the signals received are solely from the plasma system under test. Typical RF signals detected by a sensor have an extremely low amplitude (e.g. in the order of −60 to −100 dBm) and the received signals are usually or often in the near field region of the electromagnetic fields (cf. S. Kelly and P. J. McNally, Appl. Phys. Express 10 (2017) 096101).

Many other plasma systems could be and, in practice, typically are in close proximity to the plasma system under test. In many situations a plasma system will be designed to be similar or nearly identical to its neighbours including the plasma system with is being measured by a RES system. A further problem is that the receiver or transceiver of the RES could potentially interfere with the sensor.

The sensors (e.g. one or more RF antennae) typically operate in the near field and are constrained in size by the actual construction of the individual plasma system under test. A suitable sensor that can be used is a wideband EM sensor. As a result, the RF sensors for a RES system tend to be very small. Typical RF sensors dimensions could be in the order of 1 cm$^2$. These small transceiver sensors must not be swamped by unwanted RF signals. Furthermore, interference levels due to strong E-fields and be B-fields from uncontrolled RF emissions from other sources in the environment can be quite high. The present disclosure describes a SAS for a RES that ensures very good isolation from such interference.

The present disclosure achieves this end by isolating the sensor through separating the sensor from the receiver or transceiver. In particular, the sensor is provided in a separate enclosure from the receiver or transceiver. In one embodiment the SAS comprises an antenna head enclosure (AHE), which comprises the sensing component of the SAS. The sensing component is preferably one or more of a single ended NF E-field and/or NF B-field antenna(s). The AHE is placed in close proximity to a plasma system (e.g. a plasma process chamber) so that the AHE is in the electromagnetic near field generated by the plasma of the plasma system. The signals received by the sensor of the AHE are then transported via electrical cable to a separate Remote Transceiver Head (RTH). The RTH contains the signal transceiver subsystem.

One example of a cable is coaxial cable, or "coax". Coax is a type of electrical cable that has an inner conductor surrounded by a tubular insulating layer, surrounded by a tubular conducting shield.

Another example of a cable is Twinaxial cabling, or "Twinax". Twinax is a type of cable similar to coaxial cable, but with two inner conductors instead of one. Due to cost efficiency it is becoming common in modern very-short-range high-speed differential signal applications.

A further example of a cable is Triaxial cable, often referred to as "Triax". Triax is a type of electrical cable similar to coaxial cable, but with the addition of an extra layer of insulation and a second conducting sheath. It provides greater bandwidth and rejection of interference than coaxial or twinaxial cables.

The electromagnetic sensor preferably comprises an antenna. Antennas have two connection ports. One port is typically connected to a signal wire and the other port to a ground wire. Thus, when coupling an antenna to a cable either twinax or triax cable would typically be used in the art. With reference to the cable shown in FIG. 1, a cable consists of two wires 101 inside the cable—a signal wire 102 and a ground wire/sheath 103. Inside the cable itself, the signal wire 102 is typically in the centre of the cable with the ground wire/sheath 103 surrounding it. The outer ground sheath carries part of the RF signal and serves to shield the main signal wire to some degree from outside RF interference. This type of cabling arrangement is known as an unbalanced cable.

However, any length of cable can behave like an antenna. As a result, the inner wire 102 can behave like an antenna and pick up unwanted RF noise 105, such as common mode current signals, thereby degrading the signal.

In order to avoid this problem, a differential balun is used. A differential balun (short for "balanced-unbalanced") is a two-port component placed between single-ended source (i.e. a source, such as an antenna, having single signal port and a ground referenced port) and differential load (i.e. a load having two-ports, each receiving two signals, where the load responds to the electrical difference between the two signals) or vice-versa. To put it differently, a balun is used to convert a single ended signal (also known as an unbalanced signal) into a differential signal (also known as a balanced signal) or to convert a differential signal into a single ended signal. Baluns typically use a two-winding transformer with one side grounded and the other side floating (differential). A balun does not have an identified "input" and "output" port, i.e. it is typically a reciprocal device.

Through using a differential balun, a single-ended source such as an antenna can be coupled to differential cable(s).

Figure 2:
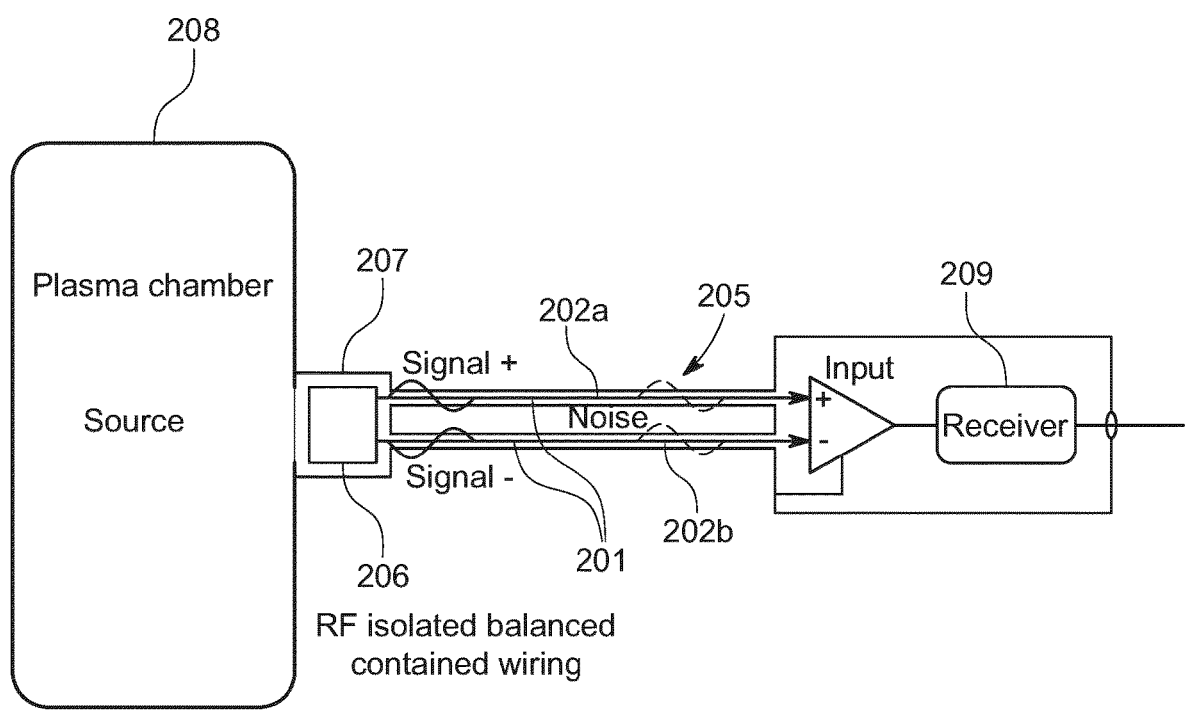
FIG. 2 illustrates an example of balanced wiring.

FIG. 2 shows a balanced cable which comprises three wires 201: two signals wires 202a and 202b plus a separate ground sheath 203. As in an unbalanced cable, the ground sheath 203 still surrounds the signal wires and is used as a shield against interference. Balanced cables use the two signal wires 202a and 202b to each carry a copy of the signal 205, a positive copy 202a and a negative copy 202b (i.e. the two copies are sent with their polarity reversed). FIG. 2 shows the antenna 206 comprising an electromagnetic RF isolation barrier 207 which cooperates with the plasma chamber 208 to form a RF isolated channel or 'pipe' from the plasma chamber 208 to the antenna 206. As the two copies of the signal travel along the cable, they are exposed to the same RF noise signal. As a result, inverting the negative copy and adding it to the positive signal has the effect of cancelling the RF noise signal. This leads to improved noise immunity. Preferably the signal from the antenna within the RF barrier 207 enclosure is carried within the cable to a remote receiver head 209 enclosure while maintaining a RF sealed unit from the antenna 207 to the receiver head 209.

Figure 4:
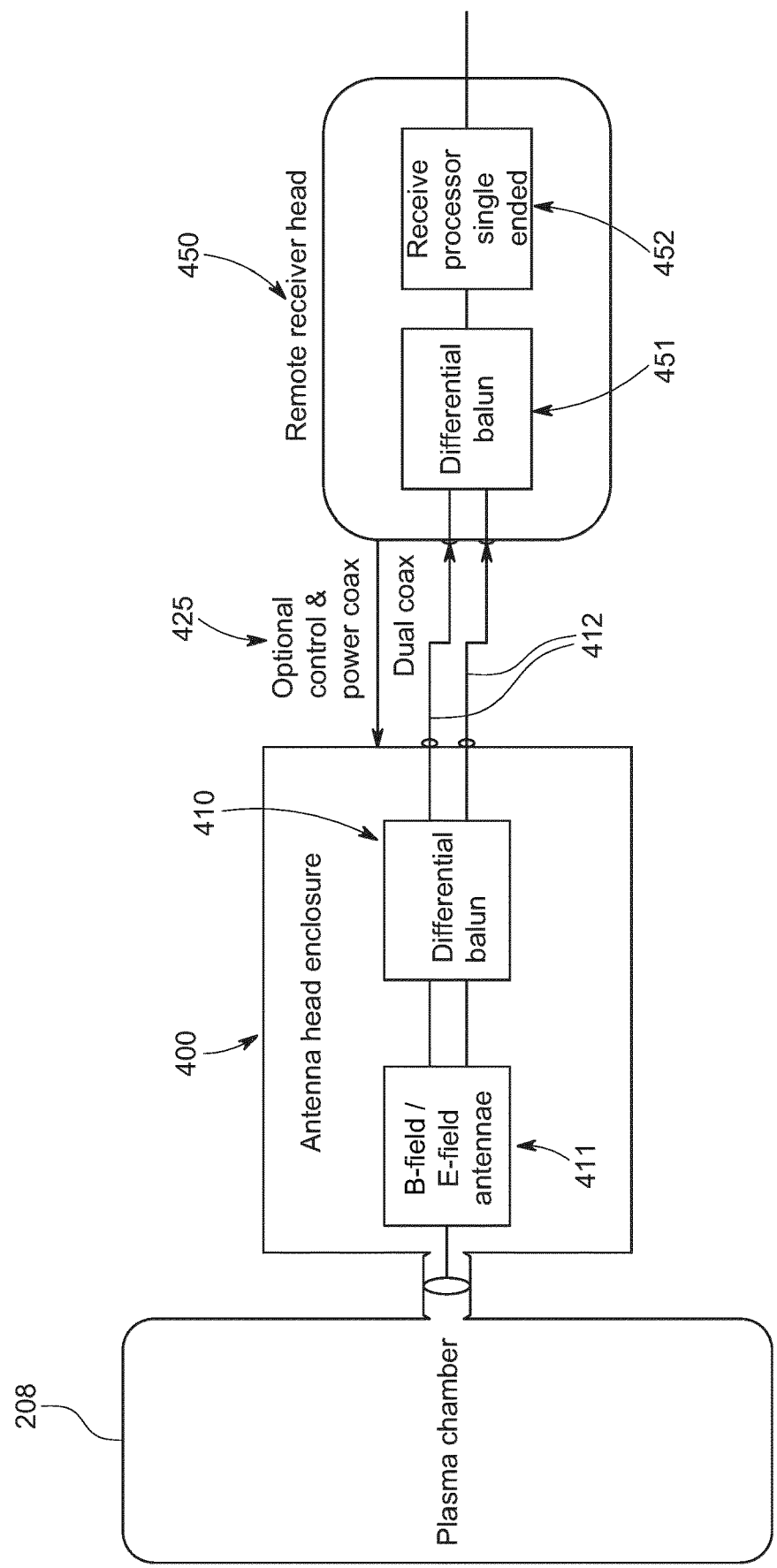
FIG. 4 illustrates one example of an antenna head and remote transceiver.

Thus, as shown in FIG. 4, through the use of a first differential balun 410, the output from a single-ended source 411 such as an antenna can be provided as a balanced signal. This allows the use of balanced differential cables 412 to transport the received signal from the antenna head enclosure (AHE) 400 to a separate remote receiver head (RTH) 450. Because of the use of the differential balun 410, two coaxial cables can be used to transport the differential/balanced signals towards the RTH 450. Preferably the antenna head enclosure (AHE) 400 running all the way to a separate remote receiver head (RTH) 450 are in a RF sealed unit in order to define a channel or pipe from the antenna head 400 to the receiver head (RTH) 450.

Within the RTH 450 another differential balun 451 is used to convert the balanced differential signal back to a single-ended unbalanced signal for connection to the receiver or transceiver 452. In other words, this signal is converted back to a signal configuration such as a single coaxial Bayonet Neill-Concelman (BNC) or SubMiniature Version A (SMA) plug connector, which connects directly to the transceiver system.

It will be appreciated that the combination of the baluns and the differential signal being passed through the dual coax cables completes the RF isolation pipe between the head unit and the remote receiver. In effect the invention provides RF containment of the signals from measurement at the plasma chamber 208 and the signals sent to the receiver 209.

Optionally, a control line 425 can be provided to provide power and/or control signals from the RTH to the AHE.

Figure 3:
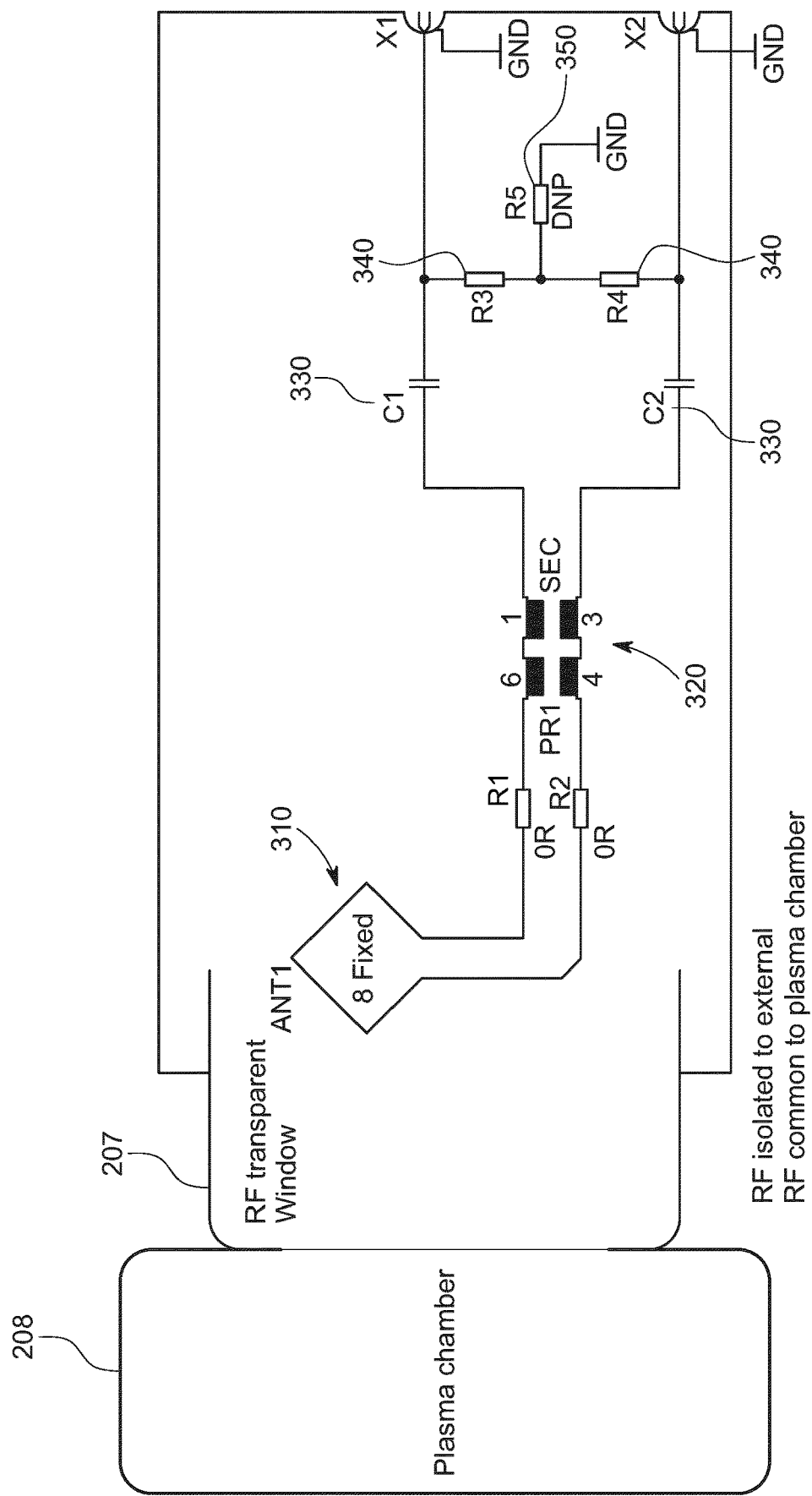
FIG. 3 shows an example circuit for a balanced line from an antenna.

FIG. 3 shows a circuit diagram of an example embodiment using differential balun with an RF sensor (antenna) within an electrically isolated antenna enclosure. As shown in FIG. 3, an antenna 310, (preferably a B-field loop antenna) is connected to a high-frequency transformer 320 which functions as a balun and transfers any unbalanced signal received to a balanced differential transmission line. The transmission line is AC coupled to connectors X1 and X2 using capacitors 330 to remove unwanted galvanic currents from the signal. The transmission line is terminated with a combination of resistors 340. The balance point of the line may be terminated using an electrical load 350 such as e.g. a resistor.

Figure 6:
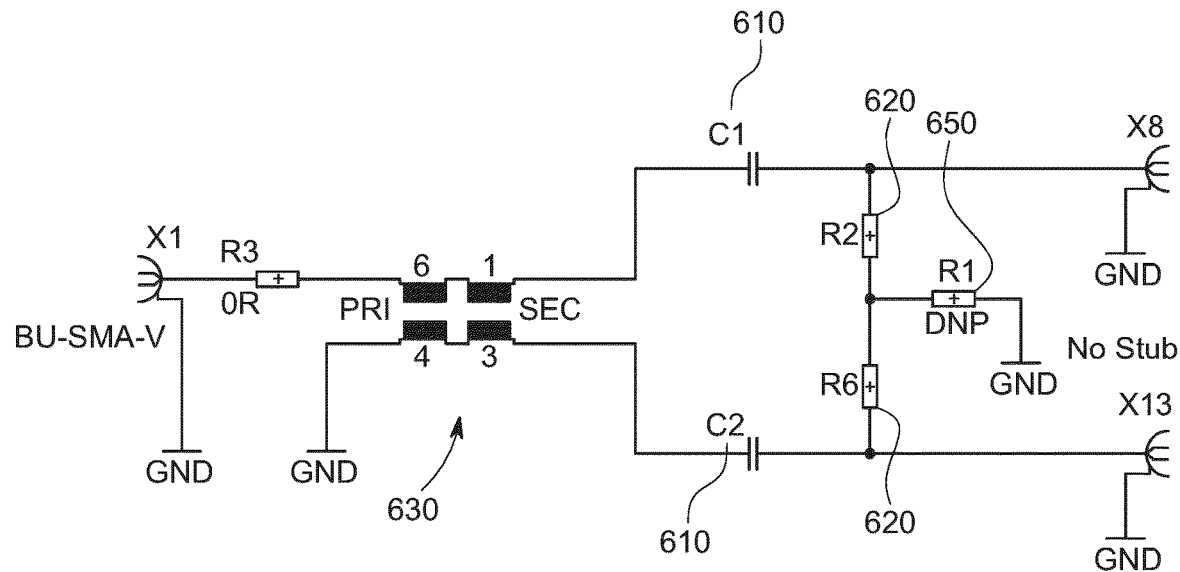
FIG. 6 shows a circuit for connecting an unbalanced antenna to a balanced line.

The present disclosure is also directed towards a system and component layout for the RTH which also utilises a differential balun. As shown in FIG. 6, one exemplary circuit for coupling dual coaxial balanced inputs from the AHE to a single ended transceiver. In particular, ports X8 and X13 are configured for coupling to the dual coaxial balanced inputs and are AC coupled to a transmission line using capacitors 610 to remove unwanted galvanic currents from the signal. The transmission line is terminated with a combination of resistors 620. The balance point of the line may be terminated using an electrical load 650 such as e.g. a resistor. The transmission line provides the received differential signal to a high-frequency transformer 630 which functions as a balun which converts the differential signal to a single ended signal. The single ended signal is provided to port X1 for connection to a single ended transceiver. A person skilled in the art will again note that other configurations can use different circuit components (e.g. different valued resistors, capacitors, etc.) and topologies, and the embodiment shown above is illustrative.

As shown in FIGS. 2 and 6, the signal line is carried in a grounded coaxial cable and so also is the phase-inverted signal carried in a separate coaxial cable. Each of these cables is shielded itself and when the signal is transported via the two coaxial lines to the analysis chamber this process is reversed. This balun/dual-coax/balun configuration ensures that there is a common ground running from the sensor unit through to a signal processing unit.

This comprises of the application of the dual coax system where the coax common ground is that of the RF live system and the balanced differential signal is contained within. This unique system whereby the coax reduces the induction of RF currents due to the ambient tool noise (for example from the plasma chamber under investigation and also the adjacent operating chambers), but also the use of the balanced differential system contained within that system, which contributes to the significant reduction of induced noise. This configuration enables locating the active processing components away from the chamber itself, whilst still maintaining the integrity of low intensity signals that need to be processed. This configuration enables the system to locate the sensor head adjacent to the chamber wall and yet carry the extremely low-level wideband signal away to a remote detection system for processing while protecting against inter-chamber and other external noise.

In one embodiment measuring the difference in phase between current and voltage variations inside the plasma itself can be achieved. The voltage variations are efficiently detected by an Electric-field (E-field) sensor/antenna via capacitive coupling to the antenna; the current variations are most effectively detected by a magnetic field (B-field) sensor/antenna which inductively coupled to the conduction and displacement currents inside the plasma.

Within the plasma, there are 'layers' with different properties and in these layers different frequencies travel within these different regions. This has the effect of changing the phase of the different frequencies for different operating points of the plasma. By measurement of these different frequencies phase-difference, much data can be derived about the physical attributes of the operation of the plasma. By examining the phase spectrum that results from the data processing of the signals, much information can be derived about the current state of the plasma.

Additional sensors can be used in combination with the present invention. For example RF sensors placed at different locations around the plasma port, for example in the microwave region of the spectrum are sensitive to microwave emissions from different regions in the plasma chamber wherein the plasma itself is not spatially homogenous. Waveguiding effects between the inductive power coils and the plasma body in an inductively coupled plasma will produce microwave emission which is fundamentally different from microwave emission components from the bulk of the plasma.

Figure 5:
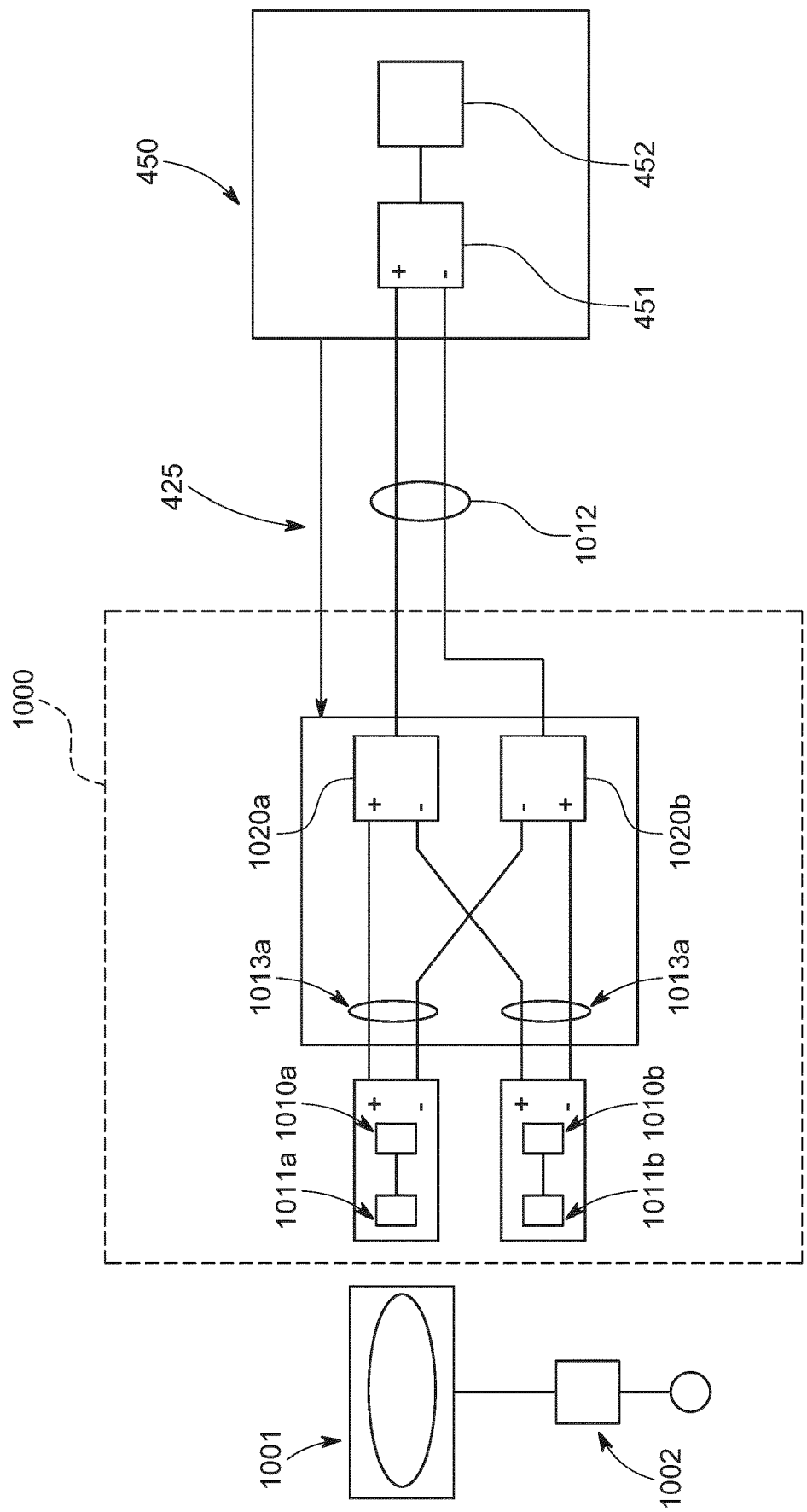
FIG. 5 illustrates another example of an antenna head and remote transceiver.

FIG. 5 shows an alternative embodiment of the present disclosure. In particular, this alternative embodiment involves the use of two antennae within an AHE 1000. With reference to FIG. 5, a first antenna 1011*a* is located in a first RF shield (e.g. a shielded case) for mounting to the port of a plasma chamber 1001 as previously described. The first antenna 1011*a* is connected to a first balun 1010*a* to convert the signal received by the first antenna to a first differential signal 1013*a*. Optionally, in this embodiment (and the previous embodiment) the balun can be further shielded with a metal (e.g. copper). A second antenna 1011*b* is located in a second RF shield (e.g. a shielded case) for mounting within the matching unit 1002 of the plasma chamber on the output side. Similarly to the first antenna 1011*a*, the second antenna 1011*b* is connected to a second balun 1010*b* to convert the signal received by the second antenna 1011*b* to a second differential signal 1013*b*.

The first 1013*a* and second 1013*b* are cross coupled to a third balun 1020*a* and fourth balun 1020*b* to produce an output differential signal 1012. The output differential signal is provided to an RTH 450 as described above with reference to FIG. 4. An optional control and/or power line 425 can be provided from the RTH 450 to the AHE 1000.

The advantage of this arrangement is that the output differential signal provided by the AHE 1000 is a function of the phase shift between the first antenna 1011*a* and the second antenna 1011*b*. To put it differently, the output differential signal 1012 is a measurement of the phase difference across substrate/workpiece being processed in the plasma chamber 1001.

Figure 7:
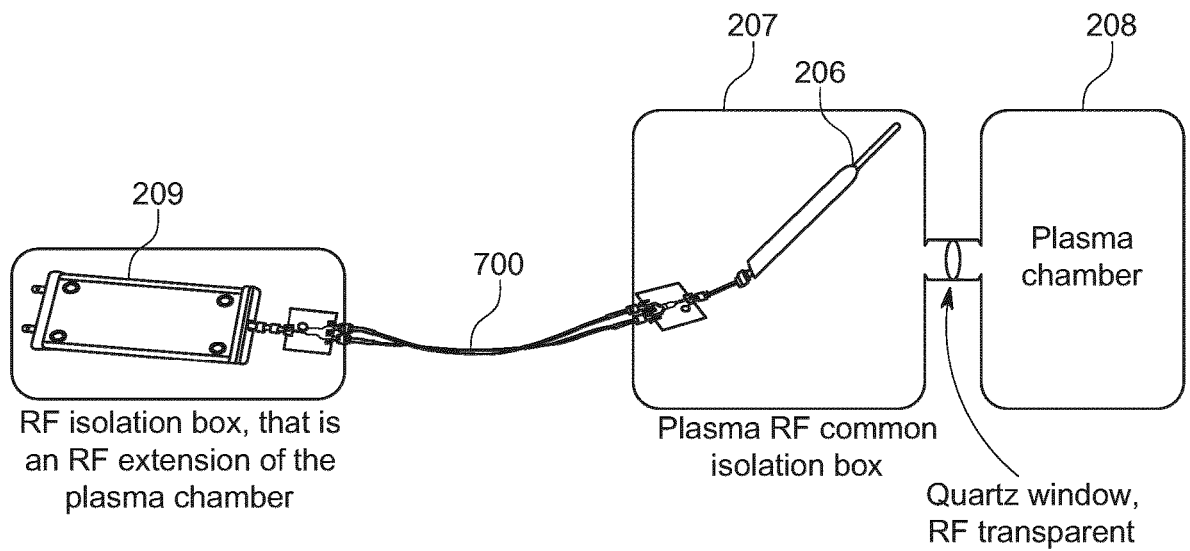
FIG. 7 shows a transceiver connected to an antenna for transmitting the signal received by a sensor to a control unit.

FIG. 7 shows an example block diagram of the invention, similar to FIG. 2, showing a transceiver connected to an antenna 206 for transmitting the signal received by a sensor to a receiver 209. The antenna 206 comprises a RF isolation barrier 207 which cooperates with the plasma chamber 208 to form a RF isolated channel or 'pipe' from the plasma chamber 208 to the antenna 206, as described above with respect to FIGS. 2 to 6. The combination of the baluns and the differential signal being passed through the dual coax cables 700 completes the RF isolation pipe between the antenna 206 and the remote receiver 209 which can house a control unit. The cables 700 can be arranged in parallel and arranged so that there are no kinks etc. so that the signals are not degraded or compromised.

Of course, the examples above are merely exemplary, and a person skilled in the art will recognise that there are many alternative ways in which the systems, methods and apparatuses disclosed herein can be implemented without departing from the spirit and scope of the present disclosure.

For example, instead of being performed on a single ended output from the balun of the RTH, differential amplification can be performed on the input of the balun of the RTH.

It will be appreciated that the approach described herein with respect to the figures can be used for more than two antenna simultaneously, for example several antenna at several view-ports can be implemented. In other words, multiple versions of the "balun-dual coax-balun" topology could be used to bring the signals from multiple antennae connected to the AHE and then onwards to the SAS, which itself could not handle signals from one, two, three or more antennae at the AHE.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. a memory stick or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. An apparatus to detect electromagnetic radiation or signals emitted by plasma comprising a sensor unit comprising a first sensing unit, wherein the first sensing unit comprises:
   a first sensor for detecting electromagnetic radiation or signals;

an electromagnetic barrier, wherein in the electromagnetic barrier is configured to surround the first sensor to prevent ambient electromagnetic radiation or signals reaching the first sensor;

a first port through which electromagnetic radiation or signals can pass, wherein the first port is configured for coupling to a port of a plasma chamber such that electromagnetic radiation or signals emitted from the plasma can reach the first senor; and a first output coupled with a balun and a dual coaxial system whereby, in use, a signal sensed is grounded and a phase reversed version of the signal is grounded.

2. The apparatus of claim 1, wherein the first output is a balanced output configured for coupling to one or more cables to provide a differential signal.

3. The apparatus of claim 1, wherein the balun is configured to convert an unbalanced signal provided by the first sensor to a balanced signal provided to the first output.

4. The apparatus of claim 1, wherein the sensor unit comprises a second sensing unit, wherein the second sensing unit comprises: a second sensor configured to detect electromagnetic radiation or signals;

an electromagnetic barrier wherein in the electromagnetic barrier is configured to surround the second sensor to prevent ambient electromagnetic radiation or signals from reaching the second sensor;

a second port through which electromagnetic radiation or signals can pass, wherein the second port is configured for attachment to a matching unit of the plasma chamber such that electromagnetic radiation or signals emitted from the matching unit of the plasma chamber can a second output, coupled to the second sensor, wherein the second output is configured to be coupled to a cable.

5. The apparatus of claim 4, wherein the first and second outputs are balanced outputs.

6. The apparatus of claim 1, wherein the first and/or second outputs are cross coupled to baluns to produce a third output, wherein the third output is a balanced output which is a function of the phase difference between the signal received by the first sensor and the signal received by the second sensor.

7. A signal acquisition system (SAS) for detecting electromagnetic radiation or signals emitted by a plasma comprising:

an apparatus for detecting electromagnetic radiation or signals according to any preceding claim;

a further enclosure comprising: a receiver, transmitter or a transceiver for providing the signal obtained by the apparatus to a control unit; and an electromagnetic barrier wherein in the electromagnetic barrier is configured to surround the transmitter or transceiver to prevent ambient electromagnetic radiation or signals from reaching the transmitter or transceiver; and at least one cable for providing the signal received by the apparatus to the transmitter or transceiver.

8. The SAS of claim 7, wherein the cable is a balanced cable.

9. The SAS of claim 7, wherein the cable is a pair of coaxial cables, wherein the cables are configured to connect a ground connection from the apparatus to the further enclosure.

10. An apparatus to detect electromagnetic radiation or signals emitted by plasma comprising:

a first sensor for detecting electromagnetic radiation or signals;

an electromagnetic barrier, wherein in the electromagnetic barrier is configured to surround the first sensor to prevent ambient electromagnetic radiation or signals reaching the first sensor;

a first port, wherein the first port is configured for coupling to a port of a plasma chamber such that electromagnetic radiation or signals emitted from the plasma can reach the first senor; and a first output coupled with a balun and a dual coaxial system whereby, in use, a signal sensed is grounded and a phase reversed version of the signal is grounded.

* * * * *